United States Patent [19]

Akatsuka

[11] Patent Number: 4,723,081

[45] Date of Patent: Feb. 2, 1988

[54] CMOS INTEGRATED CIRCUIT PROTECTED FROM LATCH-UP PHENOMENON

[75] Inventor: Yasuo Akatsuka, Tokyo, Japan

[73] Assignee: NEC Corporation, Tokyo, Japan

[21] Appl. No.: 774,683

[22] Filed: Sep. 11, 1985

[30] Foreign Application Priority Data

Sep. 11, 1984 [JP] Japan ................... 59-189884

[51] Int. Cl.$^4$ ................... H03K 3/26; H03K 3/29; H03K 5/153; H02H 3/20
[52] U.S. Cl. ................... 307/200 B; 307/279; 307/291; 307/363; 307/443; 307/451; 361/91
[58] Field of Search ............ 307/443, 296 R, 200 B, 307/451, 363, 585, 291, 279; 361/92, 88, 101, 91

[56] References Cited

U.S. PATENT DOCUMENTS 4,353,105  10/1982  Black ........................ 307/200 B Primary Examiner—John S. Heyman
Assistant Examiner—M. R. Wambach
Attorney, Agent, or Firm—Sughrue, Mion, Zinn, Macpeak, and Seas

[57] ABSTRACT

A CMOS integrated circuit formed in a first semiconductor substrate is supplied with a power through a power control circuit formed in a second semiconductor substrate. The power control circuit is, for example, a flip-flop using the CMOS integrated circuit as one load and detects that a resistance value of the one load is decreased below a predetermined value and decreases power supplied to the CMOS integrated circuit in response to the detection.

7 Claims, 6 Drawing Figures

CMOS INTEGRATED CIRCUIT PROTECTED FROM LATCH-UP PHENOMENON

BACKGROUND OF THE INVENTION

1. Field of the Invention

This invention relates to a CMOS integrated circuit, and more particularly to protection of a CMOS integrated circuit from a breakdown when the so-called latch-up phenomenon is generated.

2. Description of the Prior Art

The CMOS integrated circuit is composed of N- and P-channel MOS field effect transistors (hereinafter, referred to as N- and P-MOS FET's) one of which is formed in a semiconductor substrate of one conductivity type and the another of which is formed in a will region of other conductivity type which is formed in the semiconductor substrate. The structure inherently involves many parasitic transistors. For example, if an N type substrate and a P type well region are used, the source region of the P-MOS FET, the substrate and the well region form a PNP bipolar transistor and the source region of the N-MOS FET, the well region and the substrate form an NPN transistor. Besides, those PNP and NPN transistors equivalently form a PNPN thyristor. Another PNP bipolar transistor is formed by the source region of the P-MOS FET, the substrate and the well region. The former and latter PNP bipolar transistors have common base and collector regions. A positive power voltage is supplied to the substrate, while the well region is supplied with a grounding potential. The drain regions of the P-and N-MOS FET's are connected to an output terminal.

If a noise having a positive voltage higher than the power supply voltage is applied to the output terminal, the latter PNP bipolar transistor turns on. The collector current flows to the grounding point of the well region. This current biases the NPN bipolar transistor to turn on by the resistive component of the well region. The collector current of the NPN bipolar transistor flows to the power supplying point and biases the former PNP bipolar transistor to turn on by the resistive component of the substrate. By turning on the NPN and former PNP bipolar transistors, the PNPN thyristor turns on to lower the impedance between the power supplying and grounding points. The thus lowered impedance allows a large current to flow though the substrate and the well region. This current becomes 10 to 50 times the operating current and causes the thermal breakdown of PN junctions and the melt of wiring metal. This is known as the latch-up phenomenon and is peculiar to the CMOS integrated circuit.

SUMMARY OF THE INVENTION

The primary object of the invention is to provide a CMOS integrated circuit which is prevented from breakdown even when the latch-up phenomenon arises.

According to the present invention, there is provided an integrated circuit structure comprising a semiconductor substrate in which two types of MOS FET's are formed, a power source and a power control means interposed between the power supplying point and the power source for lowering the power current supplied to the circuit in the semiconductor substrate through the power supplying point when the potential at the power supplying point is detected to be lower than a predetermined value. The power controlling means comprises, for example, a flip-flop circuit having two transistors and two loads. One of the loads has a value to determine the predetermined value. The other of the leads is the CMOS circuit made of the two types of MOS FET's in the semiconductor substrate. The power controlling means is favorably isolated from the CMOS circuit, in the semiconductor substrate.

According to the present invention, the latch-up phenomenon in the semiconductor substrate is detected as a decrease in the potential at the power supplying point or as an increase in the current flowing through the power supplying point, and in response to the detection of the latch-up, the power current flowing through the CMOS circuit in the semiconductor substrate is lowered. Therefore, the circuit elements and wirings of the CMOS circuit in the semiconductor substrate are protected from the thermal breakdown or melting.

BRIEF DESCRIPTION OF THE DRAWINGS

The above and further objects, features and advantages of the present invention will become more apparent from the following detailed description of embodiments taken in conjunction with the accompanying drawings, wherein.

Figure 1:
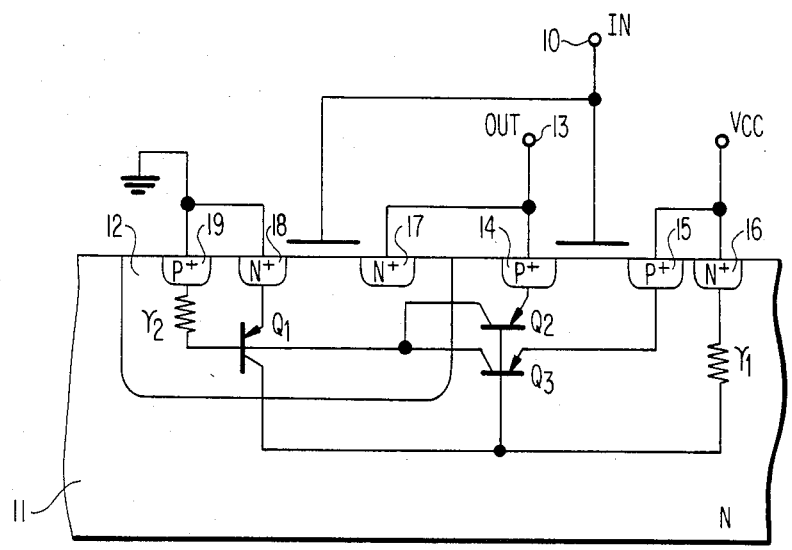
FIG. 1 is a sectional view of the CMOS integrated circuit in the prior art.

The CMOS integrated circuit in the prior art shown in FIG. 1 generally uses an N type silicon substrate 11 in which a P type well region 12 (hereinafter, referred as a P-well region) is formed. A P+ type drain region 14 and a P+ type source region 15 are diffused in the substrate 11 to form a P-MOS FET. An N+ type region 16 is also diffused and operates as a contact region for supplying positive power $V_{cc}$ to the substrate 11. An N+ type drain region 17 and an N+ type source region 18 are diffused in the P-well region 12 to form an N-MOS FET. A P+ type region 19 is also formed in the P-well region 12 as another contact region for applying a grounding potential to the P-well region 12. The P+ type source region 15 is wired to the positive power source $V_{CC}$ with the N+ type region 16. The P+ type and N+ type regions 14 and 17 are wired to an output terminal 13. The N+ type region 18 is grounded together with the P+ type region 19. The gate electrodes are commonly connected to the input terminal 10.

Many parasitic bipolar transistors $Q_1$, $Q_2$ and $Q_3$ and resistors $r_1$ and $r_2$ are inherently accompanied in the CMOS integrated circuit. The first bipolar transistor $Q_1$ is an NPN type and is formed of the N+ type region 18, the P-well region 12 and the substrate 11. The second bipolar transistor $Q_2$ is a PNP type and is formed of the P+ type region 14, the substrate 11 and the P-well region 12. The third bipolar transistor $Q_3$ is also PNP type and is formed of the P+ type region 15, the substrate 11 and the P-well region. The first resistor $r_1$ is a resistance component of the substrate 11 between the N+ type region 16 and the bases of the second and third bipolar transistors $Q_2$ and $Q_3$ which are common with the collector of the first bipolar transistor $Q_1$. The second resistor $r_2$ is a resistance component of the P-well region 12 between the P+ type region 19 and the base of the first bipolar transistor $Q_1$ which is common with collectors of the second and third bipolar transistors $Q_2$ and $Q_3$.

Figure 2:
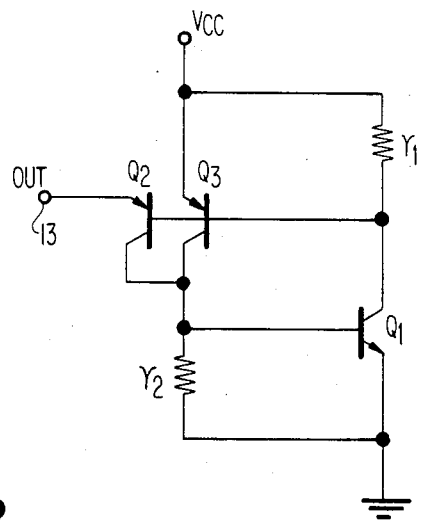
FIG. 2 is an equivalent circuit of the parasitic transistors in the CMOS integrated circuit in the prior art shown in FIG. 1.

Those parasitic bipolar transistors $Q_1$, $Q_2$ and $Q_3$ and resistors $r_1$ and $r_2$ form a circuit as shown in FIG. 2. Between the power supply $V_{cc}$ and the grounding point, the series circuit of the first bipolar transistor $Q_1$ and the first resistor $r_1$ is parallel with the series circuit of the third bipolar transistor $Q_3$ and second resistor $r_2$. The bases of the first bipolar transistor $Q_1$ and the third bipolar transistor $Q_3$ are respectively connected with collectors of the third bipolar transistor $Q_3$ and the first bipolar transistor $Q_1$ to form a PNPN thyristor between the power supply $V_{CC}$ and the grounding point. The bases and collectors of the second bipolar transistor $Q_2$ and the third bipolar transistor $Q_3$ are respectively common. The emitter of the second bipolar transistor $Q_2$ is connected with the output terminal 13.

If a noise having a higher positive voltage than the power supply $V_{cc}$ is applied to the output terminal 13, the second bipolar transistor $Q_2$ turns on to make the current flow through the second resistor $r_2$ and to the base of the first bipolar transistor $Q_1$. Due to the voltage drop across the second resistor $r_2$, the first bipolar transistor $Q_1$ turns on to make the current flow through the first resistor $r_1$ and to the base of the third bipolar transistor $Q_3$. By the voltage drop across the first resistor $r_1$, the third bipolar transistor $Q_3$ turns on. The simultaneous turning on of the bipolar transistors $Q_1$ and $Q_3$ means the turning on of the equivalent PNPN thyristor and allows a very large current to flow from the power supply $V_{cc}$ to the grounding point through the CMOS integrated circuit.

The large current burns the wirings on the CMOS integrated circuit out. Furthermore, PN junctions in the CMOS integrated circuit breakdown. Those failures cause a fatal destruction of the CMOS integrated circuit and was an inherent drawback of the CMOS integrated circuit in the prior art.

DESCRIPTION OF THE PREFERRED EMBODIMENT

Figure 3:
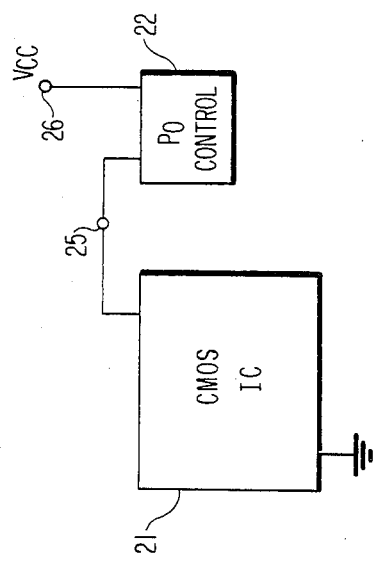
FIG. 3 is a block diagram showing a principle of the present invention.

According to the present invention, a power control means 22 is added between the internal power supply terminal 25 of the CMOS integrated circuit 21 and the external power supply terminal 26, as shown in FIG. 3. The power control means 22 controls power supplied to the CMOS integrated circuit 21 in accordance with the detection of the latch-up phenomenon. When the potential at the terminal is decreased below a predetermined value or the power current flowing through the CMOS integrated circuit 21 via the terminal 25 is increased above a predetermined value, the power control means 22 decreases the power supplied to the CMOS integrated circuit 21. Such power decrement is, for example, made by limiting the power current.

Figure 4:
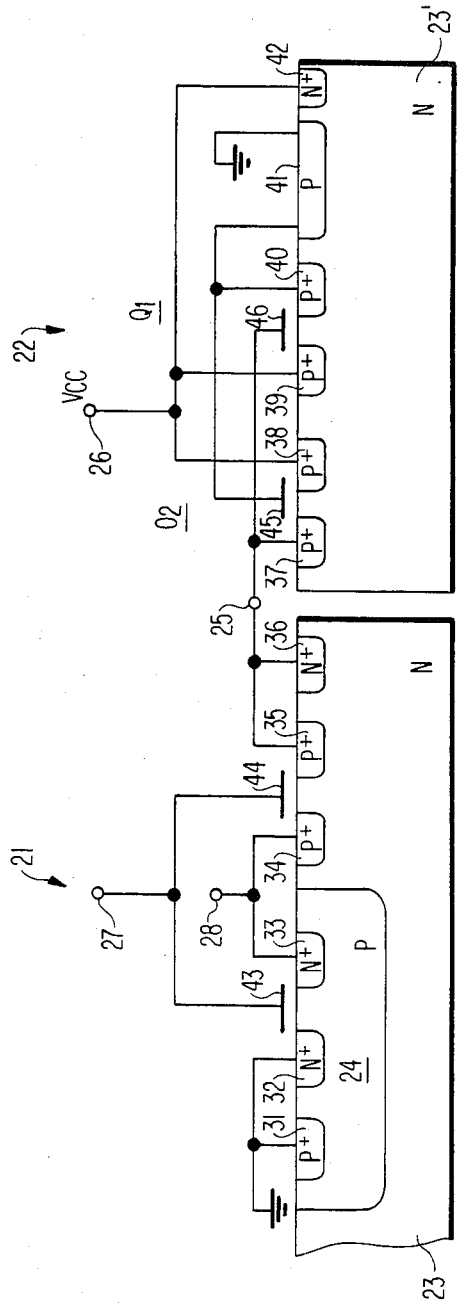
FIG. 4 is a sectional view of the integrated circuit device according to a preferred embodiment of the present invention.
Figure 5:
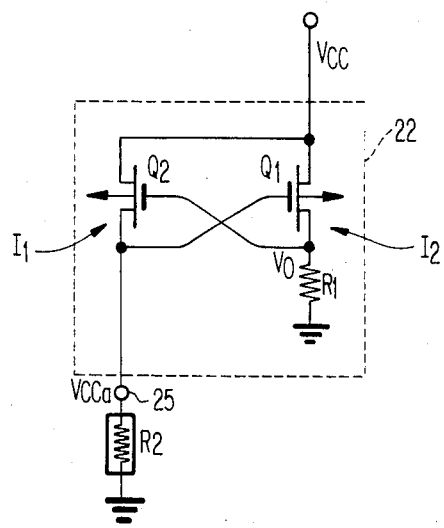
FIG. 5 is a circuit diagram of a power control means used in the preferred embodiment.
Figure 6:
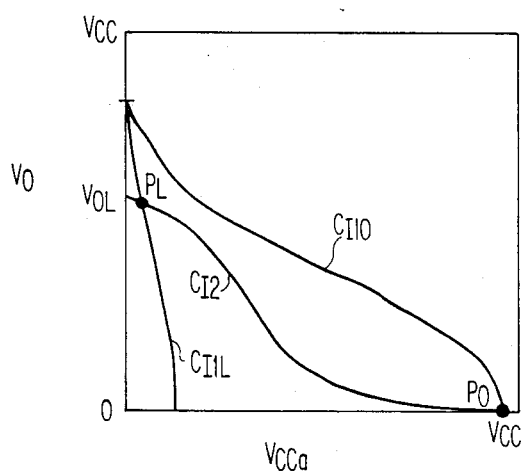
FIG. 6 is a graph showing the relationship between the voltages at the gates of MOS FET's $Q_1$ and $Q_2$ in the power control means shown in FIG. 5.

The preferred embodiment of the present invention is shown in FIGS. 4, 5 and 6. The CMOS integrated circuit device comprises an N type silicon substrate 23 on which the CMOS integrated circuit 21 is formed and an N type silicon substrate 23' on which the power control means 22 is formed. The N type substrate 23 has a P-well region 24. N+ type source and drain regions 32 and 33 are formed in the P-well region 24 to form an N-MOS FET together with a gate electrode 43. P+ type source and drain regions 35 and 34 are formed in the substrate 23 to form a P-MOS FET together with a gate electrode 44. The gate electrodes 43 and 44 are commonly connected to an input terminal 27 or other circuit of former stage. The drain regions 33 and 34 are commonly connected to an output terminal 28 or other circuit of later stage. The source region 32 is grounded together with a P+ type region 31 which is formed in the P-well region 24 to supply the grounding potential to the P-well region 24. The source region 35 is connected to an internal power supply terminal 25 together with an N+ type region 36 which is formed in the substrate 23 to supply positive power voltage to the substrate 23.

The internal power supply terminal 25 is connected with the power control means 22 to receive the power voltage $V_{CC}$ through the power control means 22. The power control means 22 is formed on the N type substrate 23' which is isolated from the N type substrate 23. P+ type source regions 38 and 39 and drain regions 37 and 40, P type resistor region 41 and an N+ type region 42 are formed in the substrate 23'. The source and drain regions 38 and 37 form a P-MOS FET $Q_2$ together with a gate electrode 45. The source and drain regions 39 and 40 form another P-MOS FET $Q_1$ together with a gate electrode 46. The source regions 38 and 39 are commonly connected to an external power supply terminal 26. The gate electrode 46 and the drain region 37 are commonly connected to the internal power supply terminal 25. The gate electrode 45 and the drain region 40 are connected to one end of the resistor region 41. The other end of the resistor region 41 is grounded. The N+ type region 42 is supplied with the power voltage $V_{CC}$ through the external power supply terminal 26.

The equivalent circuit of the structure in FIG. 4 is shown in FIG. 5. The P-MOS FET's $Q_1$ and $Q_2$ form a bistable flip-flop together with the resistor $R_1$ and the resistance component $R_2$. The resistor $R_1$ is formed of the resistor region 41, while the resistor component $R_2$ is a component of the CMOS integrated circuit 21 between the internal power supply terminal 25 and the grounding point. In the normal operation, $Q_1$ is in a high resistance state and the potential $V_0$ is near the ground potential which makes $Q_2$ in a low resistance state to supply a current $I_2$ therethrough to the resistance component $R_2$.

The latch-up phenomenon is inevitable in the CMOS integrated circuit 21, where parasitic PNP and NPN bipolar transistors are turned on by external noise to lower the resistance component $R_2$ of the CMOS circuit 21 between the internal power supply terminal 25 and the grounding point (see FIG. 5). When the resistance component $R_2$ is lowered by the latch-up phenomenon in the CMOS integrated circuit 21, the potential $V_{cca}$ at the terminal 25 is decreased (or the current $I_2$ supplied from the power supply $V_{cc}$ to flow through the N-MOS FET $Q_2$ and the resistance component $R_2$ to the ground is increased). The decrease in the potential at the point 25 is detected by the circuit 22. A lower potential at the point 25 turns the P-MOS $Q_1$ to a low resistance state by suitably selecting the resistance of the resistor $R_1$. Thereby, the potential at the node $V_0$ between $Q_1$ and $R_1$ increases to turn the P-MOS FET $Q_2$ to a high resistance state to decrease the current $I_2$. Thus, when the latch-up phenomenon occurs in the CMOS integrated circuit 21, the CMOS integrated circuit 21 is protected from being brokendown. Although the once-generated latch-up phenomenon continues until the power is cut off, the bistable flip-flop keeps the switched condition until the power is cut off. In this manner, the CMOS integrated circuit 21 is reliably protected.

The operation of the power control means 22 will now be explained in more detail with reference to FIGS. 5 and 6. The resistance component $R_2$ is about 100 to 200 ohms before the latch-up phenomenon occurs. In this condition, the relationship of the input-output voltages of the inverter $I_1$ composed of the P-MOS FET $Q_2$ and the resistance component $R_2$ is represented by the Curve $C_{I10}$. The input voltage is the potential $V_0$ at the gate of the P-MOS FET $Q_2$ and the output voltage is the potential $V_{cca}$ at the internal power supply terminal 25. The resistance component $R_2$ is about 4 to 10 ohms after the latch-up phenomenon occurs. The relationship of the input-output voltages of the inverter $I_1$ is changed to the curve $C_{IIL}$. On the other hand, the resistance of the resistor $R_1$ is selected as a predetermined value so that the operating state of the flip-flop changes by the decrease in the resistance $R_2$. In this case it takes 30 to 80 ohms which is a value between the values of the resistance components $R_2$ before and after the latch-up phenomenon occurs. Thus, the relationship between the input-output voltages of the inverter $I_2$ composed of the P-MOS FET $Q_1$ and the resistor $R_2$ is represented by the curve $C_{12}$. The input voltage for this inverter $I_2$ is $V_{cca}$ and the output voltage is $V_0$. The crossing point $P_0$ between the curves $C_{I10}$ and $C_{12}$ is an operating point before the latch-up phenomenon occurs. Almost the same voltage as the power source voltage $V_{cc}$ appears at the internal power source terminal 25. The crossing point $P_L$ between the curves $C_{IIL}$ and $C_{12}$ is an operating point after the latch-up phenomenon occurs. The voltage $V_{cca}$ at the internal power source terminal 25 becomes very small.

The two substrates 23 and 23' may be physically separated. They are required to be insulated from each other and any structure many be used therefore so long as the carriers generated in the CMOS integrated circuit 21 are prevented from reaching the power control means 22. On example of such a structure uses a N type region as the N type substrate 23' which is formed on but isolated by an insulating layer from the N type substrate 23. The circuit in the power control means 22 is not limited to the bistable flip-flop. Other bistable circuit such as a circuit controlled by a comparater may be used.

What is claimed is:
1. A CMOS integrated circuit device comprising:
a first semiconductor substrate:
first and second power supplying nodes;
first and second channel types of MOS field effect transistors formed in said first semiconductor substrate, said MOS field effect transistors constituting an electrical circuit energized by power supplied between said first and second power supplying nodes;
first and second power supplying terminals receiving an external power voltage therebetween, said second power supplying terminal being connected to said second power supplying node; and
a second semiconductor substrate physically separate from said first semiconductor substrate and having formed therein a power control circuit which is electrically interposed between said first power supplying node and said first power supplying terminal, said power control circuit including means for detecting a decrease in a resistance component of said electrical circuit between said first and second power supplying nodes and means for decreasing power to be supplied to said electrical circuit when said resistance component is lower than a predetermined value.

2. A CMOS integrated circuit as claimed in claim 1, wherein said first semiconductor substrate is of a first conductivity type and has a well region of a second conductivity type, said first channel type MOS field effect transistors being formed in said first semiconductor substrate and said second channel type MOS field effect transistor being formed in said well region.

3. A CMOS integrated circuit as claimed in claim 2, wherein said power control circuit comprises a flip-flop circuit including first and second MOS field effect transistors having sources commonly connected to said first power supplying terminal, and a resistor, one end of said resistor being connected with the drain of said first MOS field effect transistor and the gate of said second MOS field effect transistor, the other end of said resistor being connected with said second power supplying terminal, and said second power supplying node being connected to the drain of said second MOS field effect transistor and the gate of said first MOS field effect transistor.

4. A CMOS integrated circuit device comprising:
first and second semiconductor substrates of one conductivity type;
a well region of another conductivity type formed in said first semiconductor substrate;
a first insulated gate field effect transistor of a first channel type having source and drain regions of said another conductivity type formed in said first semiconductor substrate and a gate electrode formed on said first semiconductor substrate between said source and drain regions;
a second insulated gate field effect transistor of a second channel type having source and drain regions of said one conductivity type formed in said well region and a gate electrode formed on said well region between said source and drain regions of said second insulated gate field effect transistor;
third and fourth insulated gate field effect transistors of said first channel type having source and drain regions of said another conductivity type formed in said second semiconductor substrate and gate electrodes form on said second semiconductor substrate between said source and drain regions of said third and fourth insulated gate field effect transistors;
a resistor region of said another conductivity type formed in said second semiconductor substrate and having first and second end portions;
first and second power terminals supplied with a power voltage therebetween;
means for connecting said gate electrodes of said first and second insulated gate field effect transistors to receive an input signal;
means for connecting said drain regions of said first and second insulated gate field effect transistors to produce an output signal;
means for connecting said source regions of said third and fourth insulated gate field effect transistors, said second semiconductor substrate and said first power terminal;

means for connecting said gate electrode of said third insulated gate field effect transistor, said drain region of said fourth insulated gate field effect transistor and said first end portion of said resistor region;

means for connecting said drain region of said third insulated gate field effect transistor, said gate electrode of said fourth insulated gate field effect transistor, said source region of said first insulated gate field effect transistor and said first semiconductor substrate; and means for connecting said source region of said second insulated gate field effect transistor, said well region, said second end of said resistor region, and said second power terminal.

5. An integrated circuit device comprising:

an electrical circuit formed on a first semiconductor substrate with first and second channel type MOS field effect transistors;

a power terminal receiving an external power voltage;

power control means for controlling power supplied to said electrical circuit from said power terminal, said power control means including:

a first MOS field effect transistor having a source connected to said power terminal, a drain and a gate;

a second MOS field effect transistor having a source connected to said power terminal, a drain connected to said gate of said first MOS field effect transistor and said electrical circuit, and a gate connected to said drain of said first MOS field effect transistor; and a resistor having one end connected to said drain of said first MOS field effect transistor and said gate of said second MOS field effect transistor;

said integrated circuit device comprising a reference voltage terminal connected to other end of said resistor.

6. An integrated circuit device as claimed in claim 5, further comprising a second semiconductor substrate, physically separate from said first semiconductor substrate, wherein said power control means is formed on said second semiconductor substrate.

7. An integrated circuit device as claimed in claim 6, wherein said resistor has such a value that said second MOS field effect transistors turns off when a current flowing through said electrical circuit is larger than a predetermined value, but turns on otherwise.

* * * * *

UNITED STATES PATENT AND TRADEMARK OFFICE
CERTIFICATE OF CORRECTION

PATENT NO.   : 4,723,081

DATED        : February 2, 1988

INVENTOR(S)  : AKATSUKA

It is certified that error appears in the above-identified patent and that said Letters Patent is hereby corrected as shown below:

COLUMN 1, LINE 16   Delete "will" insert --well--

COLUMN 2, LINE  3   Delete "leads" insert --loads--

COLUMN 5, LINE 20   Delete "$C_{IIL}$" and insert --$C_{I1L}$--

COLUMN 5, LINE 29   Delete "$C_{12}$" and insert --$C_{I2}$--

COLUMN 5, LINE 31   Delete "$C_{12}$" and insert --$C_{I2}$--

COLUMN 5, LINE 36   Delete "$C_{12}$" and insert --$C_{I2}$--

COLUMN 5, LINE 53   Delete ":" and insert --;--

Signed and Sealed this

Thirteenth Day of September, 1988

*Attest:*

DONALD J. QUIGG

*Attesting Officer*   *Commissioner of Patents and Trademarks*